United States Patent
McKee et al.

[11] Patent Number: 6,107,808
[45] Date of Patent: Aug. 22, 2000

[54] INTERNAL UNBALANCE DETECTION IN CAPACITORS

[75] Inventors: Gregg L. McKee, Rancho Santa Fe; Frederick W. MacDougall, San Diego, both of Calif.

[73] Assignee: Maxwell Energy Products, Inc., San Diego, Calif.

[21] Appl. No.: 09/222,589

[22] Filed: Dec. 28, 1998

[51] Int. Cl.[7] ............... G01R 31/12; H01H 31/02; H02H 3/00; H01G 5/00; G08B 21/00
[52] U.S. Cl. ............... 324/548; 324/537; 361/277; 361/93.1; 340/664
[58] Field of Search ............... 324/548, 537; 361/93.1, 277, 281, 287; 340/664

[56] References Cited

U.S. PATENT DOCUMENTS

| | | | |
|---|---|---|---|
| 2,576,132 | 11/1951 | Marbury | 175/294 |
| 2,704,341 | 3/1955 | Stacy et al. | 317/56 F |
| 2,896,049 | 7/1959 | Maier | 200/113 |
| 3,080,506 | 3/1963 | Minder | 317/12 |
| 3,125,720 | 3/1964 | Swift | 324/51 |
| 3,141,995 | 7/1964 | Smith | 317/12 |
| 3,512,149 | 5/1970 | Pugh | 340/253 |
| 3,735,250 | 5/1973 | Masui | 324/51 |
| 3,755,711 | 8/1973 | Fendt | 317/12 B |
| 3,816,800 | 6/1974 | Ringler et al. | 361/116 |
| 3,973,169 | 8/1976 | Titus | 317/12 B |
| 4,104,687 | 8/1978 | Zulaski | 361/17 |
| 4,114,089 | 9/1978 | Ahmed | 324/509 |
| 4,219,856 | 8/1980 | Danfors et al. | 361/15 |
| 4,713,604 | 12/1987 | Becker et al. | 324/500 |
| 4,805,063 | 2/1989 | Kataoka et al. | 361/16 |
| 4,956,739 | 9/1990 | Becker et al. | 361/16 |
| 4,998,098 | 3/1991 | Schweitzer, III | 324/551 |
| 5,506,743 | 4/1996 | Phillips | 361/85 |

*Primary Examiner*—Vinh P. Nguyen
*Assistant Examiner*—Jermele M. Hollington
*Attorney, Agent, or Firm*—Fitch, Even, Tabin & Flannery

[57] ABSTRACT

A capacitor is made up of a housing; a first plurality of capacitors within the housing; a second plurality of capacitors within the housing; a first electrode coupled to a first terminal, with the first terminal being electrically contactable outside the housing; a second electrode coupled to a second terminal, with the second terminal being contactable outside the housing; a threshold circuit that compares performance of the first plurality of capacitors with performance of the second plurality of capacitors, detects an unbalance, and generates an output signal; and a signal output coupled to the threshold circuit, the signal output being accessible outside the housing. In another embodiment the capacitor has a housing; a first electrode contactable from outside the housing, a second electrode contactable from outside the housing, and an unbalance detection output contactable from outside the housing, wherein an unbalance detection signal indicative of a degree of unbalance.

34 Claims, 10 Drawing Sheets

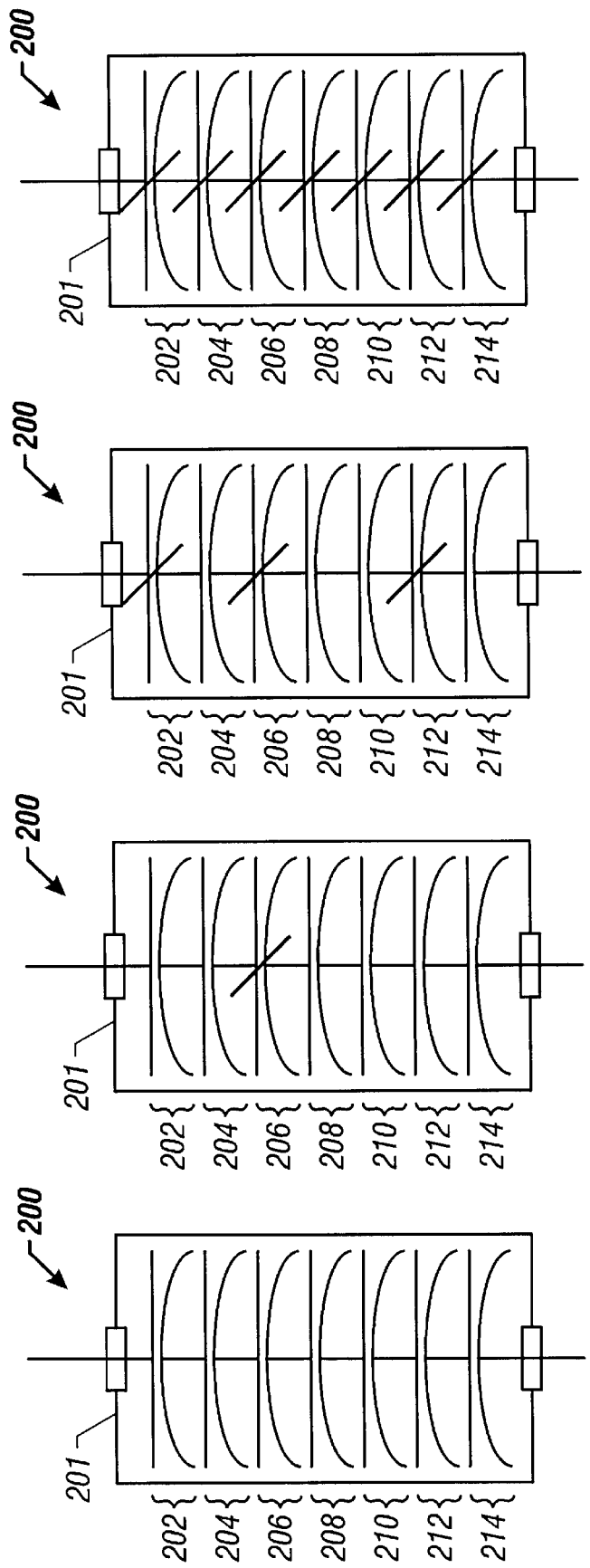

INTERNAL UNBALANCE DETECTION IN CAPACITORS

BACKGROUND OF THE INVENTION

The present invention relates to internal unbalance detection in capacitors using circuitry internal to the capacitor, and more particularly to the pre-detection of capacitor section failures within a capacitor. Even more particularly, the present invention relates to the detection of capacitor section failures within a capacitor using internal circuitry and, for example, a fiber optic output, wherein capacitor failure is detected upon, for example, a detected failure of a prescribed number of capacitor sections and capacitor failure is pre-detected, i.e., incipient capacitor failure is detected upon, for example, a detected failure of a predetermined lesser number of capacitor sections.

Present day operational equipment and research devices require the use of large capacitors connected in banks, and in some instances employ capacitor sections connected in commonly-housed capacitors. As used herein the term capacitor section refers to a single capacitor element, e.g., in general, a pair of conductive structures, e.g., plates, separated by a dielectric material. The term capacitor refers to a functional electrical component made up of at least one capacitor section, and having at least two externally accessible electrodes through electrical connection can be made to the one or more capacitor sections. The term capacitor module refers to that portion of, for example, a high voltage device, such as an accelerator or a laser, made up of at least one capacitor, and associated hardware. By high voltage it is meant a device operating at, for example, more than 5 kilovolts, e.g., 10 kilovolts.

Standard practice for high voltage capacitors dictates that each capacitor consists of several parallel series of high voltage capacitor sections in a sealed casing (or housing).

A short circuit (which is a typical failure mode for high voltage capacitor sections in high voltage capacitors) in one or more of the high voltage capacitor sections may result in a rapid increase in heat in the capacitor and may result in an explosion and ensuing fire. Since the capacitors are made of series-connected capacitor sections and because each capacitor section in the series may be operating below its maximum voltage rating, e.g., at 80% of its maximum voltage rating, damage as a result of a short circuit in one high voltage capacitor section may be temporarily held off by other capacitor sections in the series (because they will operate closer to their maximum voltage rating, but not exceed their maximum voltage rating).

As a result, it is typically difficult to even determine if a short circuit in an individual high voltage capacitor section within the sealed housing of the capacitor has occurred, before a catastrophic failure occurs. The same situation occurs for capacitors made up of capacitor sections that fail in an open circuit mode utilizing self-clearing electrodes or internal fuses. Once a single high voltage capacitor section within the capacitor fails, however, a subsequent failure of another high voltage capacitor section within the capacitor may result in remaining capacitor sections operating at or above their maximum voltage ratings. At this point one can expect the remaining high voltage capacitor sections to fail rather quickly, resulting in failure of the capacitor. Thus, while it is important that a short circuit in an individual high voltage capacitor section in a capacitor be detected and corrected as soon as possible, before explosion or fire, to prevent damage to equipment or injury to personnel, no satisfactory means of such detection is commercially available.

One prior art approach to detecting faulty capacitor sections within capacitors is to monitor liquid dielectric pressure within the capacitors. Because the liquid dielectric pressure changes abruptly, due, for example, to gas generation or when the temperature inside the capacitor rises abruptly due, for example, to a short circuit, measuring the liquid dielectric pressure provides an indication that a short circuit has occurred. Specifically, when a high voltage capacitor section fails, the high voltage capacitor section typically has a short arcing between its plates causing a build up of heat and/or gas, and in turn, a build up of pressure in the liquid dielectric, which can be measured at a pressure valve. Typically an interlock mechanism is then used to remove the capacitor from service, thus shutting down whatever system is being used with the capacitor.

Advantageously, this type of detection does not require any external electrical connections, which can pose a significant problem when capacitors are themselves series connected or operating at high voltages. (This problem arises because while any electrical outputs from short-detecting circuitry may only be a few volts in the capacitor, the voltage above "earth ground" can be on the order of several kilovolts or more.)

Unfortunately, liquid dielectric pressure detection requires long periods for detection due to a significant time required to build up sufficient heat and pressure within the liquid dielectric to result in a detection since the system must be able to handle normally expected changes in temperature due to changes in the ambient operating temperature or the internal temperature rise due to operating conditions. Thus, the time required to detect a capacitor failure by the so-called pressure method often results in explosion because of the destruction of other elements due to over-stresses leading to a short circuit in the over-stressed sections. And, even when a capacitor failure is detected, such detection is generally considered a detection of imminent failure, and thus an interlock mechanism or the like must be used to take the capacitor offline, thus shutting down whatever equipment is being used with the capacitor. Also, the pressure interrupters sometimes yield a false signal due to changes in pressure inside the capacitor associated with operating of conditions other than failure. These "unscheduled" shutdowns can be quite costly in, for example, experimental accelerators, as valuable experiments can be spoiled and valuable accelerator time lost.

An alternative approach involves monitoring voltage across each individual capacitor section within the capacitor. An example of this approach is highlighted in U.S. Pat. No. 3,125,720 (Swift) and in U.S. Pat. No. 4,805,063 (Kataoka, et al.). Each of these patents describes one or more approaches for detecting a failure by monitoring voltage across a voltage divider set in parallel with the series connected capacitor sections within the capacitor. Both of these patents, however, describe approaches that are unsuitable in extremely high voltage environments due to the requirement of electrical connections between the individual capacitor sections inside the housing of the capacitor to external unbalance detection circuits outside the housing of the capacitor, through the housing of the capacitor. As mentioned above, these electrical connections, in practice, can be of significant voltage potentials above earth ground, posing an extreme risk of arcing and risking damage to sensitive monitoring and experimentation hardware.

As pointed out above, another problem encountered in applications with which high voltage capacitors are used is that such applications require that the capacitors remain online continuously and not be unexpectedly switched out of service, such as, for example, in the event of an interlock mechanism switching the capacitor out of service upon detection of a capacitor failure. Examples of these types of systems include experimental accelerators used for the refinement of nuclear fuel, such as at Los Alamos National Laboratories, wherein a shutdown as a result of capacitor failure can result in spoiling very expensive experiments, and loss of precious accelerator time. Accordingly, prior art systems such as used in power line applications, that automatically switch capacitors out of operation using an interlock mechanism when over-voltages are detected, or that remove capacitors from operation, such as through series fuses when short-circuits are detected, are expensive and often unacceptable in many real-world applications in which high voltage capacitors are employed.

Thus, what is needed is an unbalance detection approach in which early detection (or pre-detection) of incipient capacitor failure can be made, without shutdown of the capacitor, unless a catastrophic failure, such as an explosion, of the capacitor is imminent. In this latter case, it would remain important to switch the capacitor off using, for example, an interlock mechanism, such as is known in the prior art, and for that matter switch remaining power circuits off, so as to prevent catastrophic failure, fires, and the like. However, it is also very desirable and preferable to allow capacitors with early-detected minor failures to continue to operate until repair can be scheduled and effected without interrupting valuable operations and experimentation.

The present invention advantageously addresses the above and other needs.

SUMMARY OF THE INVENTION

The present invention advantageously addresses the needs above as well as other needs by providing a method and apparatus for internal unbalance detection in capacitors.

One embodiment of the present invention can be characterized as a capacitor having a housing; a first plurality of capacitor sections in a first series within the housing; a second plurality of capacitor sections in a second series within the housing; a first electrode coupled to a first terminal of the first series, and to a first terminal of the second series, with the first terminal being electrically contactable outside the housing; a second electrode coupled to a second terminal of the first series, and to a second terminal of the second series, the second terminal being contactable outside the housing; a threshold circuit that compares performance of the first series with performance of the second series, detects an unbalance in the first series and the second series, and generates an output signal in response thereto, the output signal varying as a function of whether the unbalance is detected; and a signal output coupled to the threshold circuit, the signal output being accessible outside the housing.

Another embodiment of the present invention can be characterized as a capacitor having a housing; a first electrode contactable from outside the housing, a second electrode contactable from outside the housing, and an unbalance detection output contractible from outside the housing, wherein an unbalance detection signal indicative of a degree of unbalance is present at the unbalance detection output.

Yet another embodiment of the present invention can be characterized as a method of operating a capacitor. The method has steps of coupling a first electrode of the capacitor to a system; coupling a second electrode of the capacitor to the system; applying a voltage across the first and second electrodes; detecting an unbalance within the capacitor; determining whether a degree of such unbalance is greater than a first threshold and less than a second threshold; signaling the detected unbalance in the event the degree of such unbalance is greater than a first threshold and less than a second threshold; and determining whether the degree of such unbalance is greater than the second threshold; and initiating a shutdown of the capacitor in the event the degree of such unbalance is greater than the second threshold.

BRIEF DESCRIPTION OF THE DRAWINGS

The above and other aspects, features and advantages of the present invention will be more apparent from the following more particular description thereof, presented in conjunction with the following drawings wherein:

FIGS. 2A, 2B, 2C and 2D are a schematic diagram illustrating a progressive short circuit failure sequence, in a capacitor such as the capacitor of FIG. 1;

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
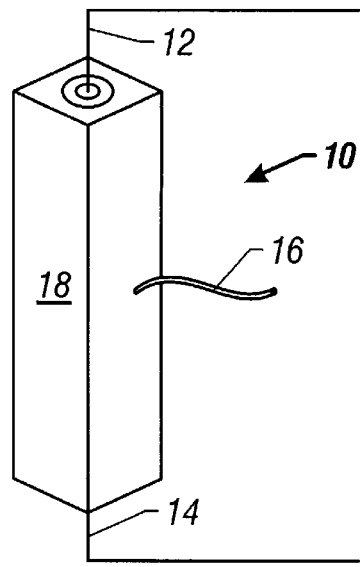
FIG. 1 is a perspective view of an exemplary capacitor in accordance with an embodiment of the present invention.

Referring first to FIG. 1, a perspective view is shown of an exemplary capacitor 10 in accordance with an embodiment of the present invention. Shown is typical of an example of a large high voltage double ended capacitor 10 having a first electrode 12 and a second electrode 14. (By high voltage it is meant a capacitor capable of operating a voltage of, for example, 5 kilovolts or more, e.g., 10 kilovolts.) Also shown is an output port 16 through which a fiberoptic cable connection is passed through a housing 18, such as a plastic insulated housing, in order to provide an unbalance detection output.

Advantageously, in accordance with the present embodiment, the unbalance detection output signals at least three possible conditions: balanced; unbalanced with predetection of capacitor failure; and unbalanced with detection of imminent capacitor failure. Thus, unlike in prior art approaches, the capacitor 10 of the present embodiment can be taken offline and replaced during a scheduled maintenance operation when predetection of capacitor failure is signaled as opposed to merely taken offline immediately upon the detection of an imminent capacitor failure. At the same time, should the capacitor 10 fail more quickly than expected, i.e., before scheduled maintenance can be performed, an interlock mechanism, such as is known in the prior art, can be used upon the signaling of imminent capacitor failure to remove the capacitor 10 from service, as well as shut down related systems, before catastrophic failure of the capacitor 10 occurs.

Further advantageously, by providing the unbalance detection output through a fiberoptic cable connection, the potentially hazardous use of external electrical connections, which may be many kilovolts above earth ground, is avoided. In other words, the capacitor 10 provides an unbalance detection scheme in which there are no exposed live parts (NELP). Alternatively, however, voltage isolation, such as is known in the art, may be used to provide a low voltage electrical conductor at the unbalance detection output. Or, acoustic coupling, such as an acoustic waveguide, can be used to communicate the unbalance detection output from unbalance detection hardware within the capacitor to circuits outside the capacitor. Further, in alternative embodiments, an sound generator may be located entirely within the capacitor, with external circuits "listening" for a particular audible signal emitted from the capacitor. In this latter variation, monitoring may be carried out entirely manually by an operator who is alerted by audio signals emanating from a capacitor in which an unbalance has been detected.

Also advantageously, the capacitor 10 performs unbalance detection internally, providing the unbalance detection output as an indication of capacitor unbalance, as opposed to requiring multiple external connections and external unbalance detection hardware. This heretofore unavailable structure provides a great deal of simplicity and increased safety not available in prior art approaches, along with the increased functionality of predetection of capacitor failure, and heightened safety and ease of design that accompany the use of the fiberoptic 16 cable as a connector for the unbalance detection output.

Referring next to FIGS. 2A, 2B, 2C and 2D, shown is a schematic diagram illustrating a failure sequence in a capacitor 200, such as the capacitor 10 of FIG. 1. A rupture of a capacitor casing 201 (or housing), particularly an oil-filled capacitor casing, can cause collateral damage far more costly than the failure of the capacitor itself.

All capacitor sections and thus capacitors, eventually reach the end of their lives. In FIGS. 2A, 2B, 2C and 2D, each of the capacitors 200 shown represents an internal series group of high voltage capacitor sections 202, 204, 206, 208, 210, 212, 214. In FIG. 2A, none of the high-voltage capacitor sections is shorted. When one of the capacitor sections 206 shorts, which is a typical failure mode for the capacitor sections 202, 204, 206, 208, 210, 212, 214 within the capacitor 200, the capacitor 200 can be represented such as shown in FIG. 2B. This type of failure would be typical of the start of a failure of the capacitor 200. Following initial failure, the number of shorted capacitor sections 202, 204, 206, 208, 210, 212, 214 normally progresses to a point where about half of the capacitor sections 204, 206, 212 are shorted, such as is shown in FIG. 2C. Once about half of the capacitor sections 202, 204, 206, 208, 210, 212, 214 are shorted, the remaining capacitor sections 204, 208 210, 214 tend to short out simultaneously due to the very high voltage stresses placed on these remaining capacitor sections 204, 208, 210, 214. A completely shorted capacitor 200 is shown in FIG. 2D. Advantageously, the present embodiment allows the detection of capacitor section failures, such as in FIG. 2B, well before complete capacitor failure, such as in FIG. 2D, occurs or is imminent. Thus, protective actions and scheduled maintenance can occur well before capacitor failure.

Figure 3:
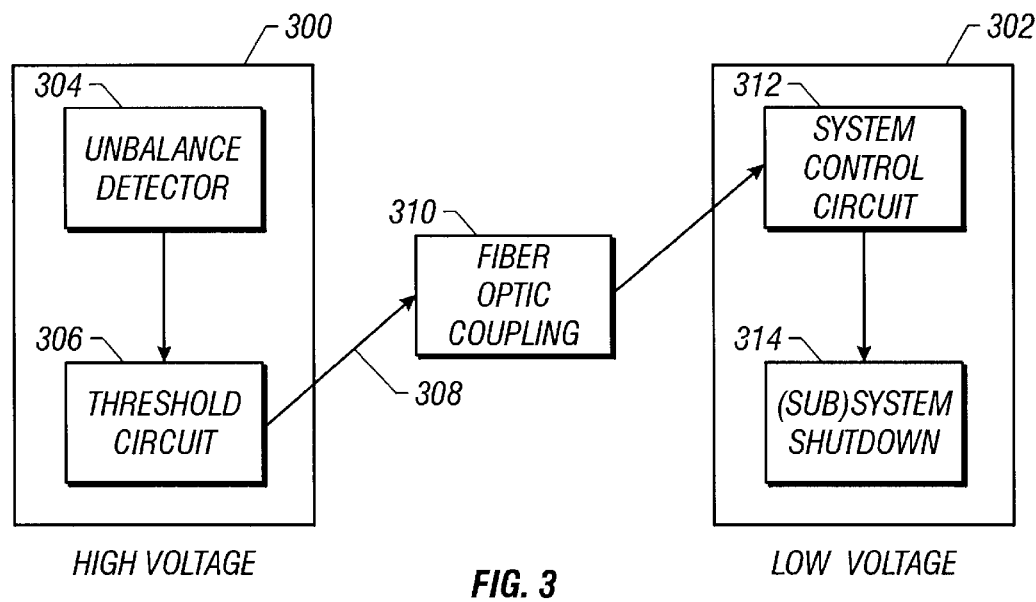
FIG. 3 is a block diagram illustrating a capacitor, such as in FIG. 1, in combination with a control unit that signals a capacitor unbalance and, in extreme cases, initiates a shutdown of the capacitor, such as by activating an interlock mechanism, in order to avoid catastrophic capacitor and/or system failure.

Referring next to FIG. 3, shown is a block diagram illustrating a capacitor 300 such as in FIG. 1, in combination with a control unit 302 that signals an unbalance detection and, in extreme cases, initiates a shut down of the capacitor 300 in order to avoid catastrophic failure.

Shown is the capacitor 300 in accordance with the present embodiment, including an unbalance detector 304 and a threshold circuit 306. Also present are a plurality of parallel-connected capacitor sections in series (not shown). An output 308 of the threshold circuit 306, which is typically in the form of a fiberoptic cable or feed, such as is shown in FIG. 1, passes through a fiberoptic coupling 310 to the control unit 302. The control unit 302 consists of a system control circuit 312, which interprets the unbalance detection output from the threshold circuit 306, signaling either that system maintenance is needed, i.e., a predetected capacitor failure, or in extreme cases, signaling an imminent capacitor failure. In the event a predetection occurs, the system control circuit 312 signals the need to replace the capacitor 300 by, for example, generating a predetection signal causing illuminating a light on a control panel (not shown) and/or the sounding of an audible alarm. In the event detection of an imminent capacitor failure occurs, the system control circuit 312 signals the need to take the capacitor offline by, for example, generating a shut down signal, which is passed to a system shutdown circuit 314, such as an interlock circuit such as are known in the art. When extreme unbalance is detected, the system control circuit 312 signals the system shutdown circuit 314, which in turn initiates shutdown of the capacitor 300 and possibly shutdown of the system with which the capacitor 300 is employed.

As shown, the unbalance detector 304 and the threshold circuit 306 are integrated into the capacitor 300 within its housing or casing, and thus are part of the capacitor 300. The casing may preferably have a non-conductive surface, such as in a plastic insulated case. In the event that any one or more capacitor sections of the capacitor 300 shorts out, the unbalance detection signal is generated by the threshold circuit 306 indicative of the unbalance itself, and its degree.

Figure 4:
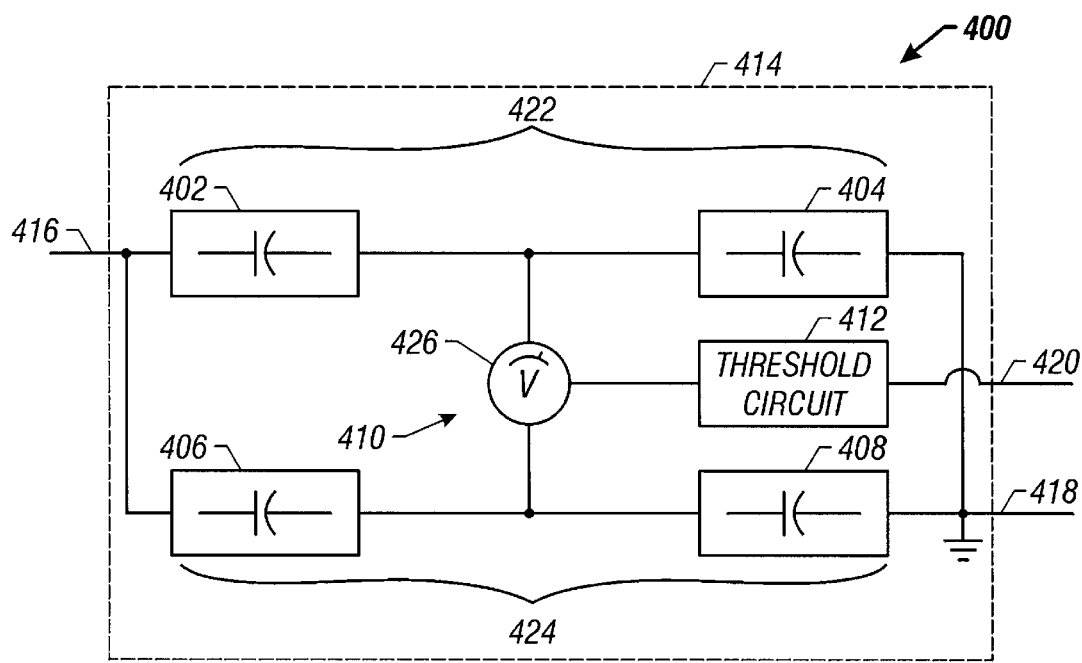
FIG. 4 is a block diagram of a capacitor such as shown in FIG. 1, with a plurality of individual capacitor sections and a voltage differential unbalance detection circuit.

Referring next to FIG. 4, shown is a block diagram of a capacitor 400 such as shown in FIG. 1, showing, by way of example, a plurality of individual capacitor sections in series 402, 404, 406, 408, a voltage unbalance detection circuit 410, and a threshold circuit 412. The capacitor 400 is enclosed within a housing 414 or casing 414 indicated with a dashed line, with the capacitor electrodes 416, 418 and the unbalance detection output 420 being shown extending from within the housing 414 to outside the housing 414. Advantageously, in accordance with the present embodiment, the capacitor electrodes 416, 418 and the unbalance detection output represent the only signal connections needed from within the capacitor housing to outside the capacitor's housing.

Within the capacitor 400, the capacitor electrodes 416, 418 are connected each to two parallel current paths 422, 424. Each current path 422, 424 is made up of a first capacitor section series 402, 406 in series with a node and a second capacitor section series 404, 408. A voltage detector 426, is interposed between the node in the first current path 422 and the node in the second current path 424 in order to measure a voltage between the nodes of the two parallel current paths 422, 424. The voltage detector 426 provides an output to the threshold circuit 412, which generates the unbalance detection signal at the unbalance detection output 420 as a function of the voltage indicated by the voltage detector 426, 428. For example, the threshold detector may signal an unbalance when the voltage measured is more than a threshold amount. The unbalance detection output 420 is provided to the outside world. Preferably, this unbalance detection output 420 is carried on a fiberoptic conductor or cable, as opposed to an electric conductor or cable so that high voltage isolation results. Advantageously, the only three outputs of the capacitor 400 that pass through the capacitor housing 414, are the two capacitor electrodes 416, 420 and the unbalance detection output 420, thereby providing a complete self-contained capacitor capable of providing a measure of unbalance detection to a control unit, such as in FIG. 2.

Figure 5:
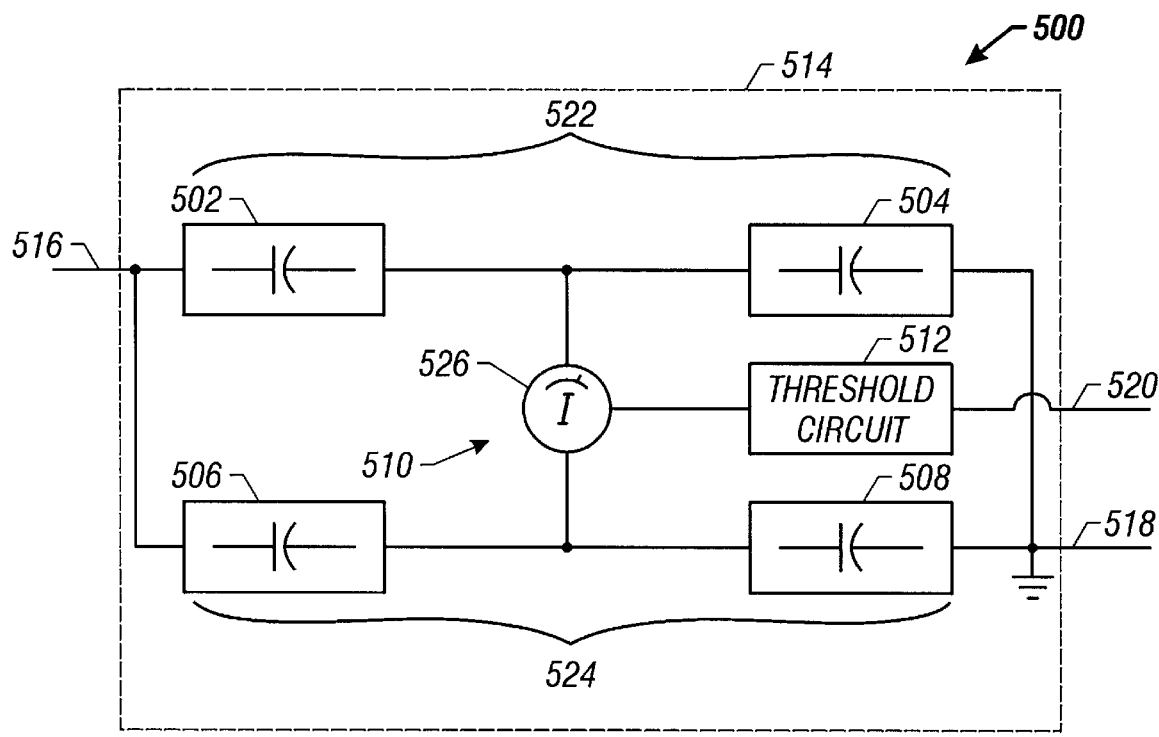
FIG. 5 is a block diagram of an alternative capacitor, such as shown in FIG. 1, with a plurality of individual capacitor sections and a current differential unbalance detection circuit.

Referring next to FIG. 5, shown is a block diagram of a capacitor 500, such as shown in FIG. 1, with a plurality of individual capacitor sections in series 502, 504, 506, 508 a current unbalance detection circuit 510 and a threshold circuit 512. The capacitor 500 is enclosed within the housing 514 or casing 514, represented with a dashed line from which each of the capacitor electrodes 516, 518 extend along with the unbalance detection output. Within the capacitor 500, each of the capacitor electrodes 516, 518 is connected to a current path 522, 524 consisting of a first of the capacitor sections in series 502, 506 in series with a node in series with a second of the capacitor sections in series in 504, 508. A current detectors 526 interposed between the node in the first current path 522 and the node in the second current path 524 in order to measure current flowing between the nodes of the current paths 522, 524. The current detector 526 is coupled to the threshold circuit 512, which compares the current flowing between the nodes of each of the current paths 522, 524. The threshold circuit 512 generates an unbalance detection output as a function of the difference between current flowing between the nodes of each of the current paths 522, 524. For example, when an unbalance occurs between the capacitor sections in the current paths 522, 524, current will flow between the nodes. When this current is more than a threshold amount, the threshold circuit, for example, indicates an unbalance in an unbalance detection signal at the unbalance detection output 510. As with the embodiment of FIG. 4, the unbalance detection output 520 is preferably in the form of a fiberoptic conductor, thereby providing voltage isolation and increasing safety. As can be seen, the only three outputs of the capacitor 500 that pass through the capacitor housing 514, are the two capacitor electrodes 516, 518 and the unbalance detection output 520, thereby providing a complete self-contained capacitor capable of providing a measure of unbalance detection to a control unit, such as shown in FIG. 2.

Figure 6:
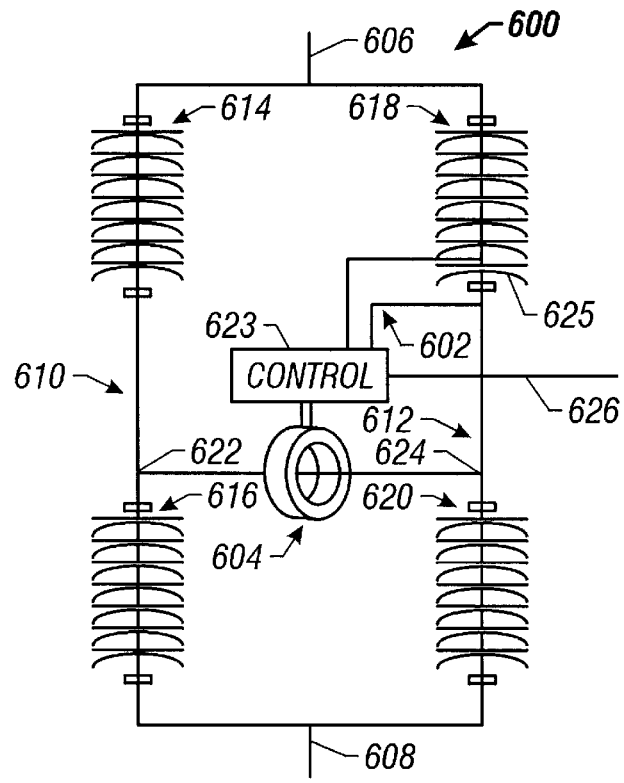
FIG. 6 is a schematic diagram of one variation of the capacitor of FIG. 1, having a capacitor voltage divider as a power input and a current transformer as a voltage differential unbalance detector.

Referring next to FIG. 6, a schematic diagram is shown of one variation of the capacitor 600 of FIG. 1 having a capacitor voltage divider power input 602 and a current transformer 604 as a voltage unbalance detector. Each of the electrodes 606, 608 of the capacitor 600 is connected to two current paths 610, 612 comprising a series of two capacitor sections in series 614, 616, 618, 620. A connection between interior nodes 622, 624 each of these current paths 610, 612 should normally not carry any current, as voltage should be balanced between these two interior nodes 622, 624. However, should an unbalance in one of the four capacitor sections in series occur 614, 616, 618, 620, current will flow through this connection inducing a voltage in the current transformer 604 and in turn at a control output. A threshold circuit 623 is powered by voltage across an individual capacitor 625 of one of the capacitor sections in series 618 so that the threshold circuit 623 can operate, for example, in a "normally on" mode. If the threshold circuit 623 is operated in a "normally on" mode. The threshold circuit 623 provides an unbalance detection output 626 for the capacitor 600 as a function of the difference in voltage at the interior nodes 622, 624.

Advantageously, the two capacitor electrodes 606, 608 and the unbalance detection output are the only connections passing through a housing 628 of the capacitor 600.

As will be recognized by the skilled artisan, the embodiment shown is somewhat arbitrary in design in that a multiplicity of current paths may be utilized each employing a multiplicity of capacitor series. Furthermore, as shown, each capacitor series is made up of seven individual capacitor sections, but a larger or smaller number of individual capacitor sections could, consistent with the teachings herein, make up each capacitor series.

In practice, if any one of the individual capacitor sections in any one of the capacitor sections in series fails, i.e., shorts, there will be a net current through the current transformer 604, triggering a response in the unbalance detection signal at the unbalance detection output. This net current will be proportional to the degree of unbalance between the two current paths. As a result, the unbalance detection output is not only indicative of unbalance, but indicative of the degree to which unbalance has occurred, and thus the degree to which capacitor failure is imminent.

The output of the threshold circuit is preferably a light source, but could in theory be an acoustic or electrical signal. Because, however, the preferred output is a light source, an optical coupling of fiberoptic cable can be used to connect threshold circuit to the control unit. Fiberoptic coupling is preferred because in high voltage circuits, capacitor operating voltage may be several orders of magnitude higher than those in the control unit and ease of coupling the signal to the external system controls.

Once the control unit detects unbalance, as indicated by the unbalance detection signal, the control unit either initiates a system shutdown or signals an impending failure, and thus the need for scheduled maintenance, depending on the degree of unbalance indicated by the unbalance detection signal. Typically shutdown is affected using, for example, an interlock, such as is known in the art.

In some applications, when the degree of unbalance is below an upper threshold, (at which shutdown would be initiated) but above a lower threshold (above noise), it may be desirable to allow the capacitor to operate even though some unbalance has been detected, so that the capacitor can be shut down for maintenance or replacement in a scheduled manner without interrupting currently operating systems. This allows a device like an experimental accelerator to continue to function until maintenance can be performed. Advantageously, because unscheduled or emergency shutdown can spoil valuable experiments, downtime costs can reach, for example, $20,000 U.S. per hour, and because having a machine unexpectedly shutdown is not desirable, the present embodiment represents a significant improvement over prior techniques, which either involve uncontrolled capacitor failure, or unscheduled shutdown.

As a matter of performance, individual capacitor sections within the capacitor are designed so that they will continue to function without causing catastrophic failure of the capacitor, even though one or more other individual capacitor sections have failed. This ability is achieved by generating the individual capacitor sections at, for example, 80% of their maximum voltage potential, so that each individual capacitor section can handle the additional voltage burden created when one of the individual capacitor sections fail. Also, the capacitor sections should be designed so that a shortened capacitor section will not generate gas or heat at an excessive rate while awaiting scheduled maintenance. Thus, combined with the present design wherein the control unit is able to determine the difference between initial failure, a progressing failure, and an imminent catastrophic failure, allows the capacitor to remain in service for a period of time following the onset of failure.

Measurement of the degree to which failure has occurred may, for example, be made by measuring a rate of flashes of light generated by the threshold circuit and transmitted through the fiberoptic cable to the control unit. Alternatively, this measurement may involve measuring voltage on an electrical output, measuring a binary output on a fiberoptic or an electrical conductor, or any of numerous other well known equivalent means for communicating degree or amount.

The sensitivity of the above-described unbalance detection scheme varies as a function of each individual capacitor section's excess voltage capacity. In other words, if each individual capacitor section is operating at 80% of its maximum voltage, failure of other capacitor sections in series therewith may continue until each remaining capacitor section in the series is at 100% of its capacity, at which time the capacitor should be shut down in order to prevent catastrophic failure. If a greater degree of sensitivity is desired, each individual capacitor section can be operated at a smaller percentage of its maximum voltage capacity.

Sensitivity can also be increased by monitoring voltage, for example, at between more than two corresponding nodes in each current path. For example, a maximum sensitivity can be achieved if voltage at nodes between each capacitor section in each capacitor series is monitored relative to voltage at corresponding nodes in the other current path, and in such case the voltage detection circuit is far more likely to detect the failure of a single capacitor section.

If, for example, voltage between every other corresponding node is monitored, a slightly lower degree of sensitivity is achieved. And, when only a single node in each current path is monitored, such as in FIG. 6, a minimum sensitivity is achieved, which for many applications may be adequate.

Another important aspect of sensitivity is driven by the application in which the capacitor is being used. If the capacitor is being used as a filter capacitor, or a normal current is small, the unbalance current will also be small. Smaller currents are more difficult to detect when unbalance occurs. Thus, if the application is such that a smaller unbalance current is generated, a more sensitive unbalance detection scheme may be required.

Figure 7:
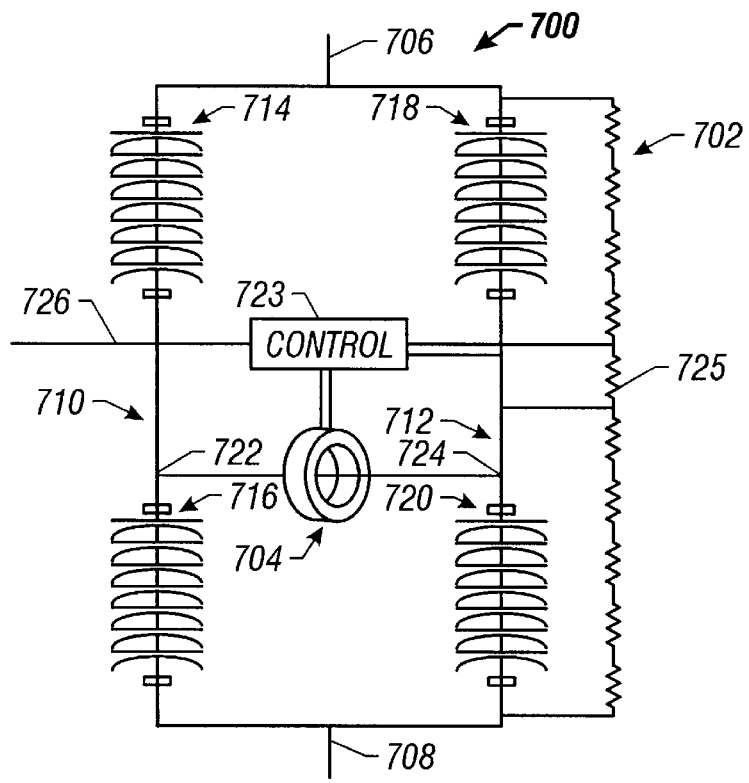
FIG. 7 is a schematic diagram of another variation of the capacitor of FIG. 1, having a resistor voltage divider as a power input and the current transformer as a voltage differential unbalance detector.

Referring next to FIG. 7, a schematic diagram is shown of another variation of the capacitor 700 of FIG. 1 having a resistor voltage divider 702 as a power input and a current transformer 704 as a voltage unbalance detector. Each of the capacitor electrodes 706, 708 of the capacitor 700 is connected to two current paths 710, 712 comprising a series of two capacitor series 714, 716, 718, 720. As with the embodiment of FIG. 6, a connection between interior nodes 722, 724 of each of these current paths 710, 712 should normally not carry any current, as voltage should be balanced between these two interior nodes 722, 724. However, should unbalance in one of the four capacitor series 714, 716, 718, 720 occur, current will flow through this connection inducing a voltage in the current transformer 704. The threshold circuit 723 is powered by voltage across an individual resistor 725 in the resistor voltage divider, which is itself connected in parallel with the current paths. (As with the embodiment of FIG. 6, this resistor voltage divider power source is needed only when the threshold circuit 723 requires a separate power source to operate, such as when it is operated in a "normally on" mode.) The threshold circuit 723 provides an unbalance detection output for the capacitor as described above.

As will be recognized by the skilled artisan, numerous variations of the illustrated embodiment are possible and contemplated by the inventors. A few of these variations are described above in reference to FIG. 6, and elsewhere throughout this patent document.

Figure 8:
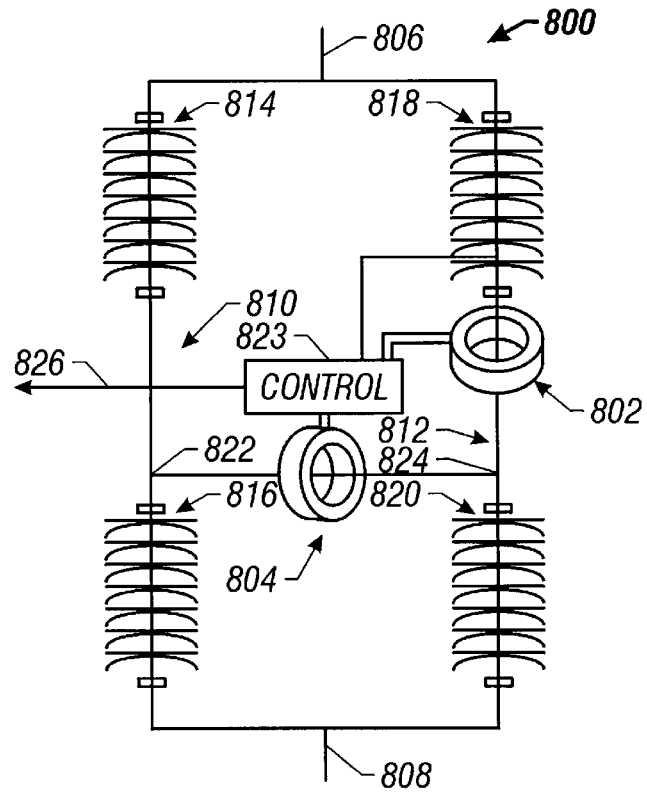
FIG. 8 is a schematic diagram of a further variation of the capacitor of FIG. 1, having a current transformer as a power input and an additional current transformer as a voltage differential unbalance detector.

Referring next to FIG. 8, a schematic diagram is shown of one variation of the capacitor 800 of FIG. 1 having a current transformer 802 as a power input and another current transformer 804 as a voltage unbalance detector. Each of the capacitor electrodes 806, 808 of the capacitor 800 is connected to two current paths 810, 812 comprising two series of capacitor sections in series 814, 816, 818, 820. As with the embodiments above, connection between interior nodes 822, 824 of each of these current paths 810, 812 should normally not carry any current, as voltage should be balanced between the two interior nodes 822, 824. However, should unbalance in one of the four series of capacitor sections 814, 816, 818, 820 occur, current will flow through this connection inducing a voltage in the other current transformer 804. Power for the threshold circuit 823 is induced by a ripple current flowing through one of the current paths 812 through the current transformer 802. (As with the embodiments above, this current transformer power source is needed only when the threshold circuit 823 requires a separate power source to operate, such as when it is operated in a "normally on" mode.) The threshold circuit 823 provides an unbalance detection output for the capacitor 800 as described above.

As will be recognized by the skilled artisan, numerous variations of the illustrated embodiment are possible and are contemplated by the inventors. A few of these variations are described above, and elsewhere throughout this patent document.

Figure 9:
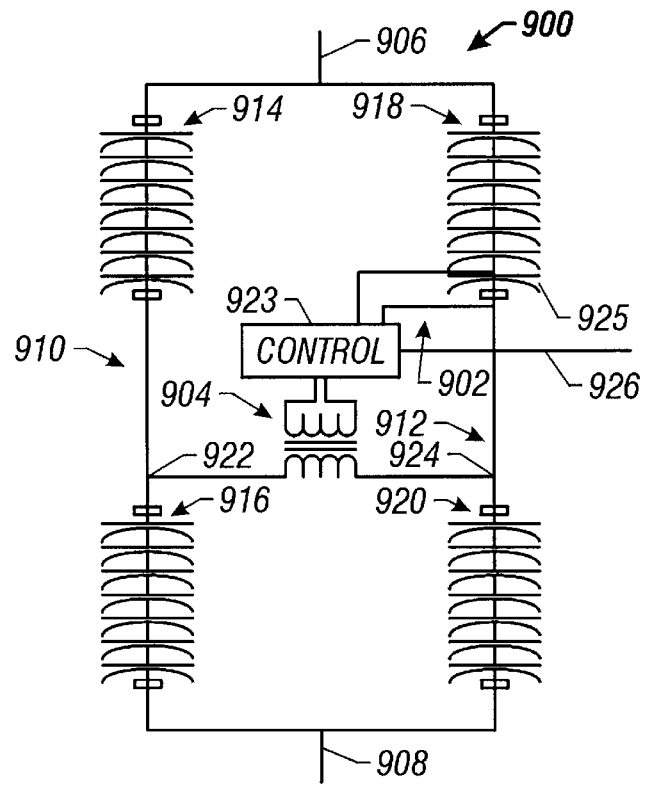
FIG. 9 is a schematic diagram of a further variation of the capacitor of FIG. 1, having a capacitor voltage divider as a power input and a potential transformer as a voltage differential unbalance detector.

Referring next to FIG. 9, a schematic diagram is shown of a further variation of the capacitor 900 of FIG. 1 having a capacitor voltage divider 902 as a power input and a potential transformer 904 as a transformer voltage unbalance detector. Each of the capacitor electrodes 906, 908 of the capacitor 900 is connected to two current paths 910, 912 comprising a series of two capacitor series 914, 916, 918, 920. As with the above embodiments, a connection through one winding of the potential transformer 904 is connected between interior nodes 922, 924 of each of these current paths 910, 912 should normally not carry any current, as voltage should be balanced between these two interior nodes 922, 924. However, should the voltage in one of the four capacitor series 914, 916, 918, 920 occur, current will flow through this connection inducing a voltage in the potential transformer 904. The threshold circuit 923 is powered by voltage across an individual capacitor section 925 of one of the capacitor sections in series 918, and provides an unbalance detection output for the capacitor as described above. (As with the above embodiments, this power source may not be needed, if, for example, the threshold circuit 923 operates in a "normally off" mode.)

As will be recognized by the skilled artisan, numerous variations of the illustrated embodiment are possible and contemplated by the inventors. A few of these variations are described above in recreance to FIG. 6 and elsewhere throughout this patent document.

Figure 10:
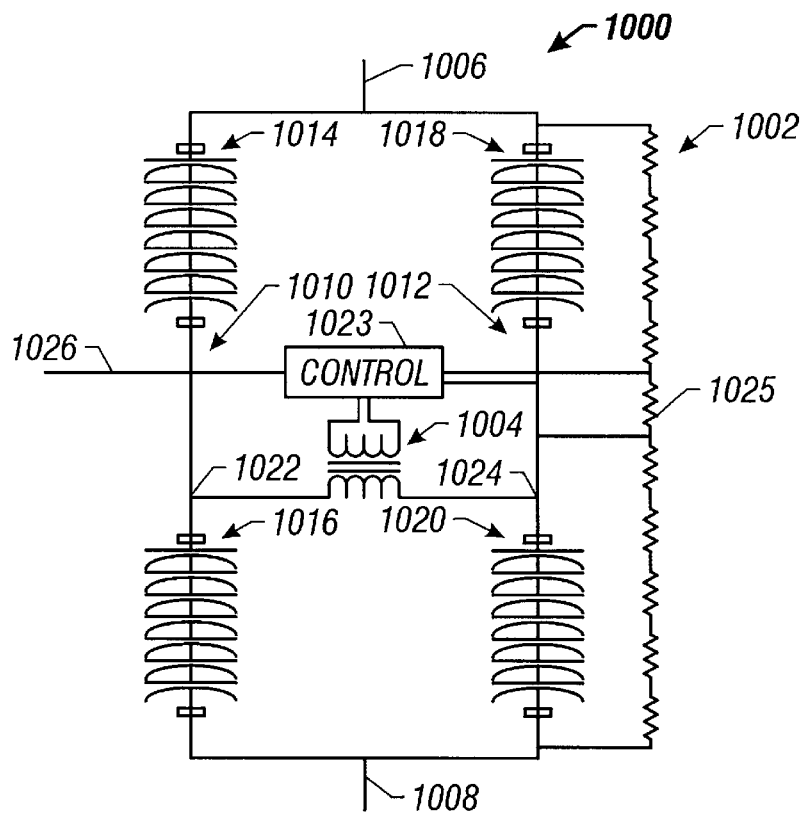
FIG. 10 is a schematic diagram of an additional variation of the capacitor of FIG. 1, having a resistor voltage divider as a power input and a potential transformer as a voltage differential unbalance detector.

Referring next to FIG. 10, a schematic diagram is shown of another further variation of the capacitor 1000 of FIG. 1 having a resistor voltage 1002 divider as a power input and a transformer 1004 as a voltage unbalance detector. Each of the capacitor electrodes 1006, 1008 of the capacitor 1000 is connected to two current paths 1010, 1012 comprising a series of two capacitor sections in series 1014, 1016, 1018, 1020. A connection through one winding of the potential transformer 1006 is connected between interior nodes 1022, 1924 of each of these current paths 1010, 1012 should normally not carry any current, as voltage should be balanced between these two interior nodes 1022, 1024. However, should the voltage in one of the four capacitor sections in series 1014, 1016, 1018, 1020 occur, current will flow through this connection inducing a voltage in the potential transformer 1004. The threshold circuit 1023 is powered by voltage across an individual resistor 1025 of the resistor voltage divider 1002, and provides an unbalance detection output for the capacitor 1000 as described above. (Again, as with the above embodiments, this power source is not needed, if, for example, the threshold circuit 1023 operates in a "normally off" mode.)

As will be recognized by the skilled artisan, numerous variations of the illustrated embodiment are possible and contemplated by the inventors. A few of these variations are described above in reference to FIG. 6 and elsewhere throughout this patent document.

Figure 11:
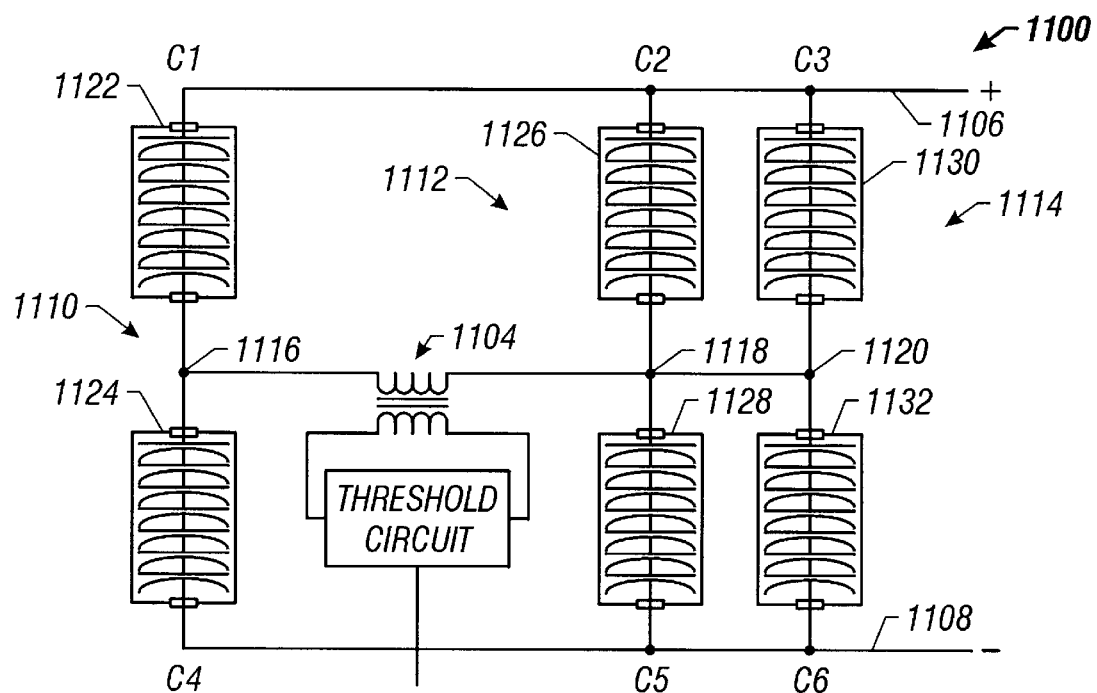
FIG. 11 is a schematic diagram of another further embodiment of the capacitor of FIG. 1, having a potential transformer as a voltage differential unbalance detector.

Referring next to FIG. 11, a schematic diagram is shown of an additional variation of the capacitor 1100 of FIG. 1 having a potential transformer 1104 as a voltage unbalance detector. Each of the electrodes 1106, 1108 of the capacitor 1100 is connected to three current paths 1110, 1112, 1114 comprising two series of capacitor sections 1122, 1124, 1126, 1128, 1130, 1132 per current path, in series. A connection between the interior nodes 1116, 1118, 1120 of each of these current paths 1110, 1112, 1114 should normally not carry any current, as voltage should be balanced between these three interior nodes 1116, 1118, 1120. However, should a change in the voltage in one of the six series of capacitor sections 1122, 1124, 1126, 1128, 1130, 1132 (two each for three current paths) occur, current will flow through this connection inducing a voltage in the potential transformer 1104. The potential transformer 1104 is interposed between a first pairing of the three interior nodes 1116, 1118 with a remaining pairing of two of the three interior nodes 1118, 1120 having a direct connection thereinbetween.

As will be recognized by the skilled artisan, numerous variations of the illustrated embodiment are possible.

Figure 12:
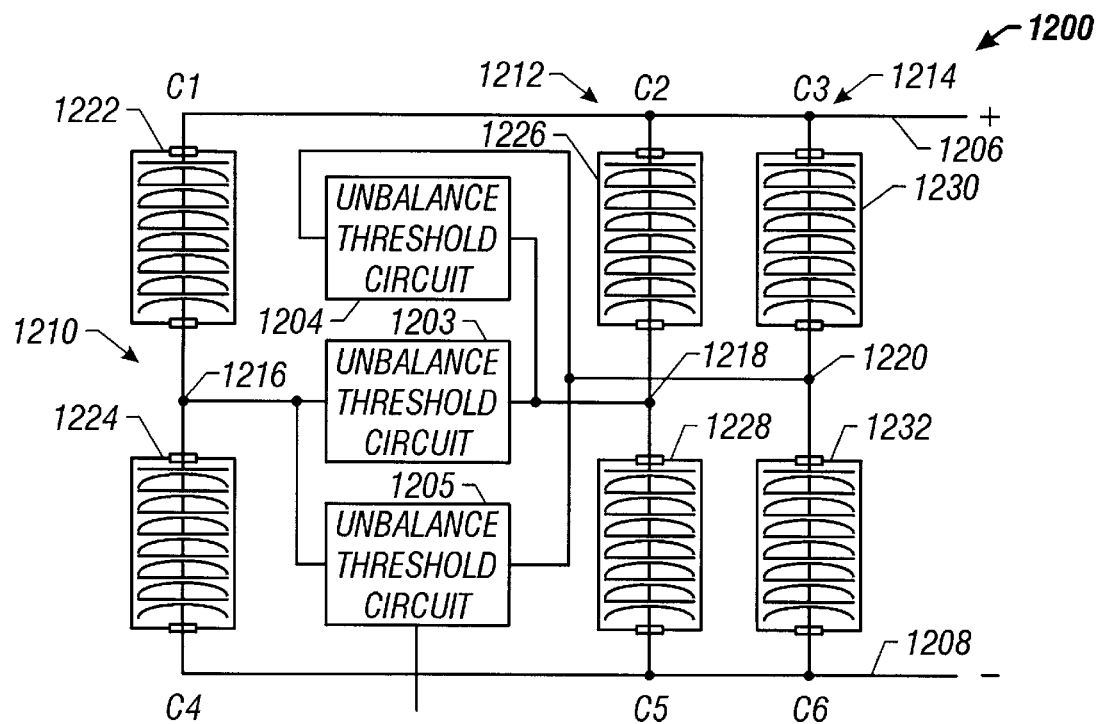
FIG. 12 is a schematic diagram of an added embodiment of the capacitor of FIG. 1 having a plurality of voltage differential unbalance detectors.

Referring to FIG. 12, a schematic diagram is shown of an added embodiment of the capacitor of FIG. 1 having a plurality of threshold circuits 1203, 1204, 1205, such as voltage potential transformers. Each of the electrodes 1206, 1208 of the capacitor 1200 is connected within the housing of the capacitor 1200 to three current paths 1210, 1212, 1214 comprising two series of capacitor sections 1222, 1224, 1226, 1228, 1230, 1232 per current path, in series. Unlike in the embodiment of FIG. 11, however, each corresponding pair of interior nodes 1216, 1218, 1220 is connected through a voltage unbalance detector 1203, 1204, 1205 such that unbalance is monitored between the interior nodes of a first pair of the current paths 1210, 1212 by a first voltage unbalance detector 1203, between a second pair of the current paths 1212, 1214, by a second voltage unbalance detector 1204, and between the interior nodes of the third pair of current paths 1210, 1214, by a third voltage unbalance detector 1205. None of these connections between the interior nodes 1216, 1218, 1220 of these current paths of 1210, 1212, 1214 should normally carry current, as well as should be balanced between the three interior nodes 1216, 1218, 1220. However, should an unbalance occur in one of the six series of capacitor sections 1222, 1224, 1226, 1228, 1230, 1232 current will flow through the two voltage unbalance detectors connected to the interior node of the current path containing the failed series of capacitor sections. Unlike with the embodiment of FIG. 10, however, sensitivity is increased in the embodiment shown in that if one of the series of capacitor sections fails in a first current path, and another of the series of capacitor sections fails in a second of the current paths, such failures will be both be detected even though voltage will appear to be balanced between these two current paths having a failed series of capacitor sections.

As will be recognized by the skilled artisan, numerous variations of the illustrated embodiment are possible, and the teachings present in the illustrated embodiment could be applied to numerous other embodiments shown in the present patent application in order to increase their sensitivity. For example, multiple current transformers could be employed to increase sensitivity in the embodiment of FIG.

15, described below, wherein current flowing through each of three possible pairs of current paths passes through one of three respective differential current transformers, each coupled to one of three respective threshold circuits.

Figure 13:
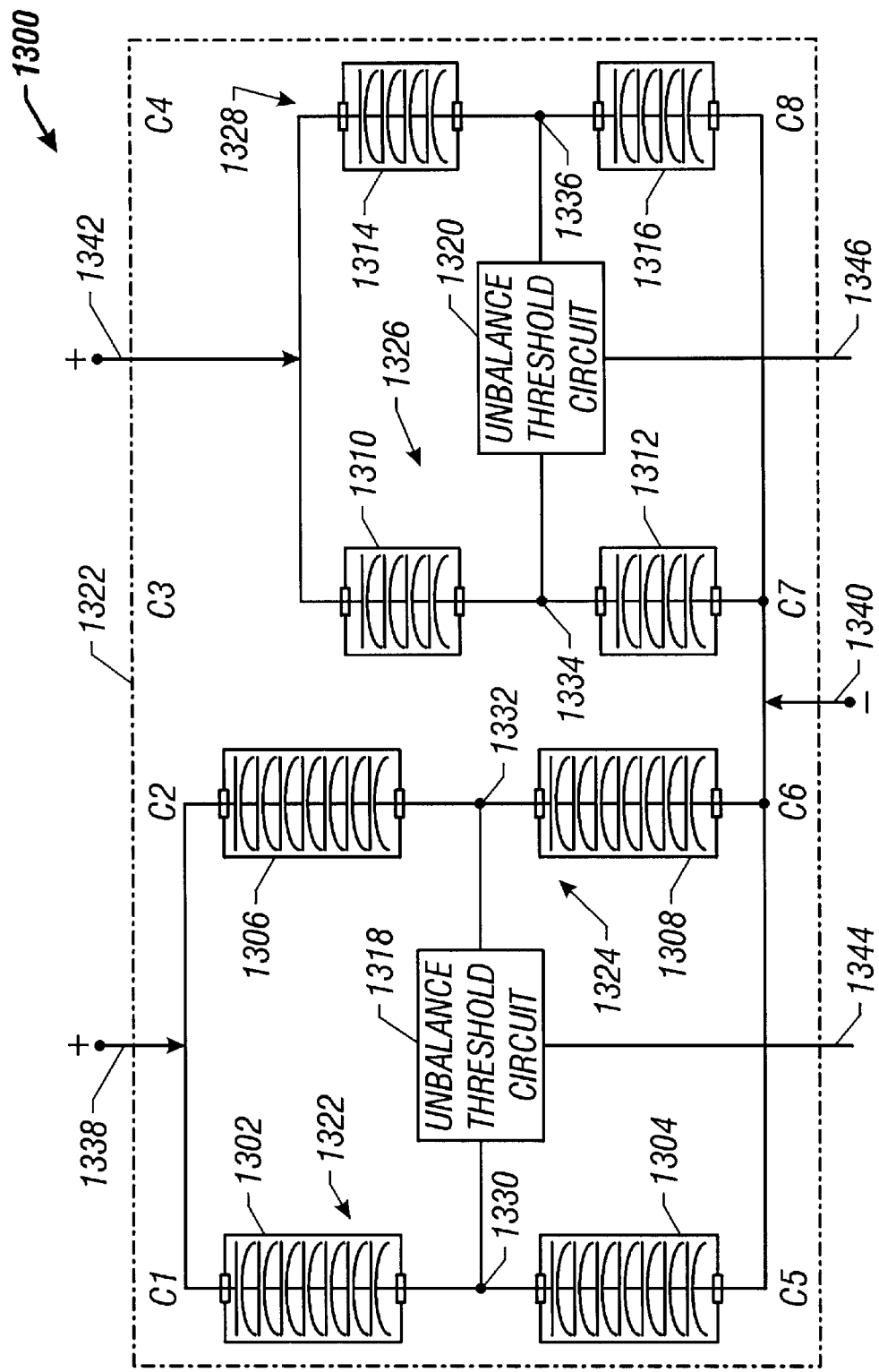
FIG. 13 is a schematic diagram of a further added embodiment of the capacitor of FIG. 1 having a plurality of capacitor banks, each with a respective voltage differential unbalance detector, and being commonly used in a single casing.

Referring next to FIG. 13, a schematic diagram is shown by further added embodiment of the capacitor 1300 of FIG. 1 having a plurality of series connected pairs of series of capacitor sections 1302, 1304, 1306, 1308, 1310, 1312, 1314, 1316, connected in parallel, each with respective voltage differential unbalance detectors 1318, 1320, and all being commonly housed in a single casing 1322. As shown, each of the series connected pairs forms one of four distinct current paths 1322, 1324, 1326, 1328, having an interior node 1330, 1332, 1334, 1336 thereinbetween. Each interior node 1330, 1332, 1334, 1336 is connected through a respective threshold circuit 1318, 1320 to another of the interior nodes 1330, 1332, 1334, 1336. Respective pairs of the current paths 1322, 1324, 1326, 1328 are connected between either a first electrode 1338 and a second electrode 1340 or a third electrode 1342 and the second electrode 1340. The first pair of the current paths 1322, 1324 is connected between the first electrode 1338 and the second electrode 1340, and is coupled together at the interior nodes 1330, 1332 of each of the first pair of current paths 1322, 1324 through a first of the threshold circuits 1318. The remaining pair of current paths 1326, 1328 is coupled between the third electrode 1342 and the second electrode 1340. Another threshold circuit 1320 couples interior nodes of the third current path 1326 and the fourth current path 1328 to one another. A common housing 1322 encloses the entire device with only the first, second and third electrodes 1338, 1340, 1342, the two respective unbalance detection outputs 1344, 1346 being provided outside the casing by the threshold detectors 1318, 1320.

Other than exhibiting the unique structure involving two distinct capacitor structures (parallel connected series of capacitor sections in series) formed into a single capacitor 1300 within a single casing 1322, each with a threshold circuit, the embodiment illustrated in FIG. 13 operates in its preferred variation similarly to embodiments described above in reference to FIGS. 6 and 7, or in reference to FIGS. 9 and 10. Accordingly further explanation of the operation of the embodiment shown in FIG. 13 is not made herein.

As will be appreciated by the skilled artisan, numerous variations of the embodiment shown can be made consistent with the teachings made herein, and such are contemplated by the inventors. Further, other embodiments illustrated herein can easily be modified with the teachings of the present embodiment, as such is also contemplated by the inventors.

Figure 14:
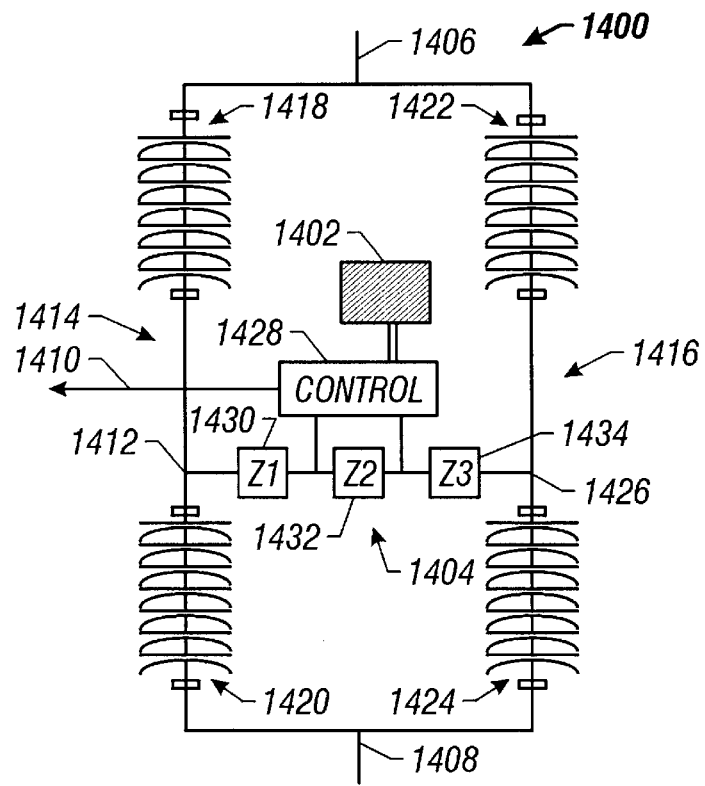
FIG. 14 is a schematic diagram of another additional embodiment of the capacitor of FIG. 1, having a voltaic or photo voltaic cell array as a power input and a signal impedance divider as a voltage differential unbalance detector.

Referring next to FIG. 14, a schematic diagram is shown of another additional embodiment of the capacitor 1400 of FIG. 1, having a photo voltaic cell array 1402 as a power input and an impedance divider 1404 as a voltage unbalance detector. A voltaic cell, such as an electrochemical battery, could also be used in this embodiment. The capacitor 1400 is shown as having three terminals 1406, 1408, 1410, including the two electrodes 1406, 1408, and the unbalance detection output 1410. The photo voltaic cell array 1402 can be used as a power source in any situation where it receives enough light to operate the threshold circuit 1428, such as where the capacitor 1400 is used in an outdoor environment, where the photo voltaic cell array can be located outdoors and remotely from the capacitor 1400 or where the capacitor 1400 is in a lighted area. If there is not enough light available, voltaic cells (batteries) can be used. As with the embodiments above, this photo voltaic power cell array is only needed where the threshold circuit 1428 requires a separate power source, such as when the threshold circuit 1428 is operated in a "normally on" mode. The capacitor 1400 employs the impedance divider 1404 between a central node 1412 of a first current path 1414 and a central node 1426 of a second current path 1416. Each current path 1414, 1416 is connected between each of the electrodes 1406, 1408 such that the current paths 1414, 1416 are in parallel relative to one another. Each current path 1414, 1416 consists of a pair of capacitor series 1418, 1420, 1422, 1424 with the central node 1412, 1426 thereinbetween.

The impedance divider 1404 is provided for the purpose of reducing signal amplitude to something useable by a threshold circuit 1428. The impedance divider 1404 is made up of three discrete impedances 1430, 1432, 1434. Across a second or center of the three impedances 1432, the threshold circuit detects measured voltage, with signal attenuation being equal to $Z2/(Z1+Z2+Z3)$, where impedances can be any combination of capacitances, inductance or resistance.

While a particular configuration is shown in FIG. 14, it will be appreciated by the skilled artisan that the embodiment of FIG. 14 lends itself to combination with the various other embodiments herein described where attenuation of signal amplitude is desirable.

Figure 15:
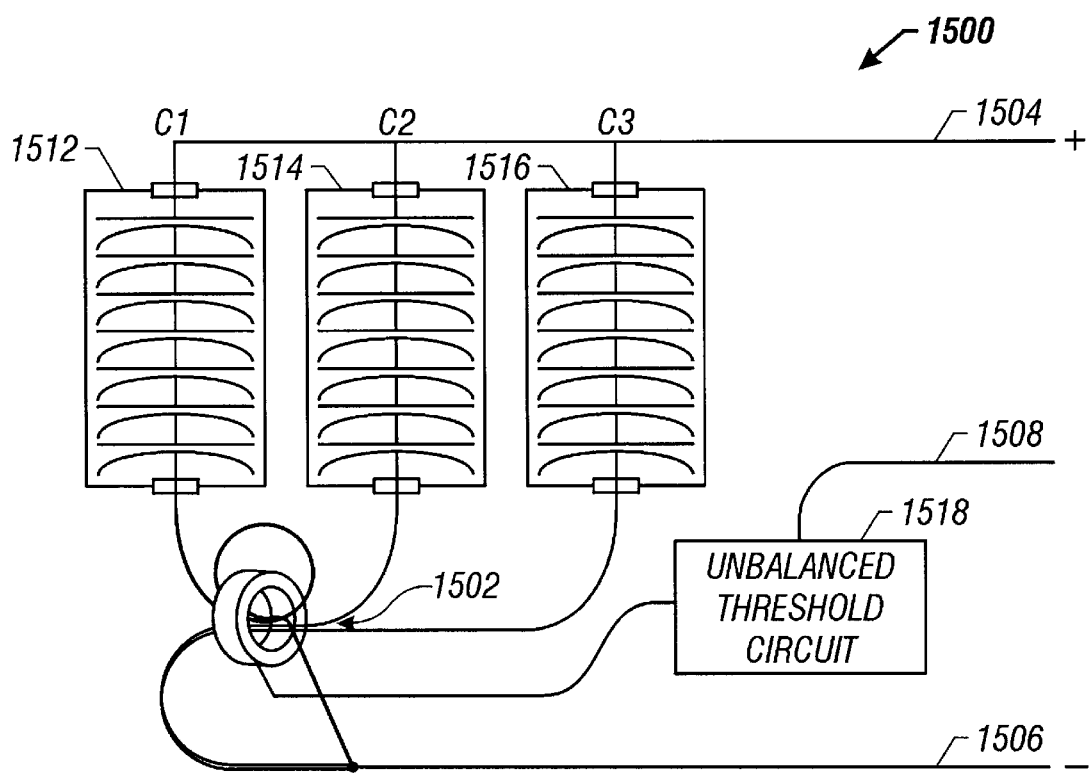
FIG. 15 is a schematic diagram of a further additional embodiment of the capacitor of FIG. 1 having a current transformer as a current differential unbalance detector.

Referring next to FIG. 15, a schematic diagram is shown of a further additional embodiment of the capacitor 1500 of FIG. 1 having a differential current transformer 1502 as a current unbalance detector. As shown, the capacitor 1500 has three terminals 1504, 1506, 1508, including the two electrodes 1504, 1506, and an unbalance detection output 1508. In the embodiment shown, three parallel capacitor sections in series 1510, 1512, 1514 are connected between each of the capacitor electrodes 1504, 1506. The capacitor sections in series 1512, 1514, 1516 are connected to the second electrode 1506 through the differential current transformer 1506 with the connection from first of the capacitor series 1512 passing through the differential transformer 1502 twice, and a connection from each of the remaining capacitor series 1514, 1516 passing through the differential transformer 1514, 1516 once. In accordance with the present embodiment, current flowing from the first capacitor series 1512 passes through differential current transformer 1502 in a first direction and current from each of the other capacitor sections in series 1514, 1516 pass through differential transformer 1502 in another direction. Thus, assuming that currents are equal, the net current through the differential transformer 1502 is zero, which would be the case when there has been no failure in any capacitor sections in the capacitor series 1512, 1514, 1516. Upon failure of a capacitor section in one of the capacitor sections in series 1512, 1514, 1516, net current through the differential transformer 1502 will no longer be zero, and furthermore, will be proportional to the unbalance. This allows a threshold circuit 1518 to determine the source and degree of unbalance and indicate such at the unbalance detection output 1508.

As with the above embodiments, the skilled artisan will appreciate the numerous variations of the illustrated embodiment that are possible and contemplated by the inventors.

Figure 16:
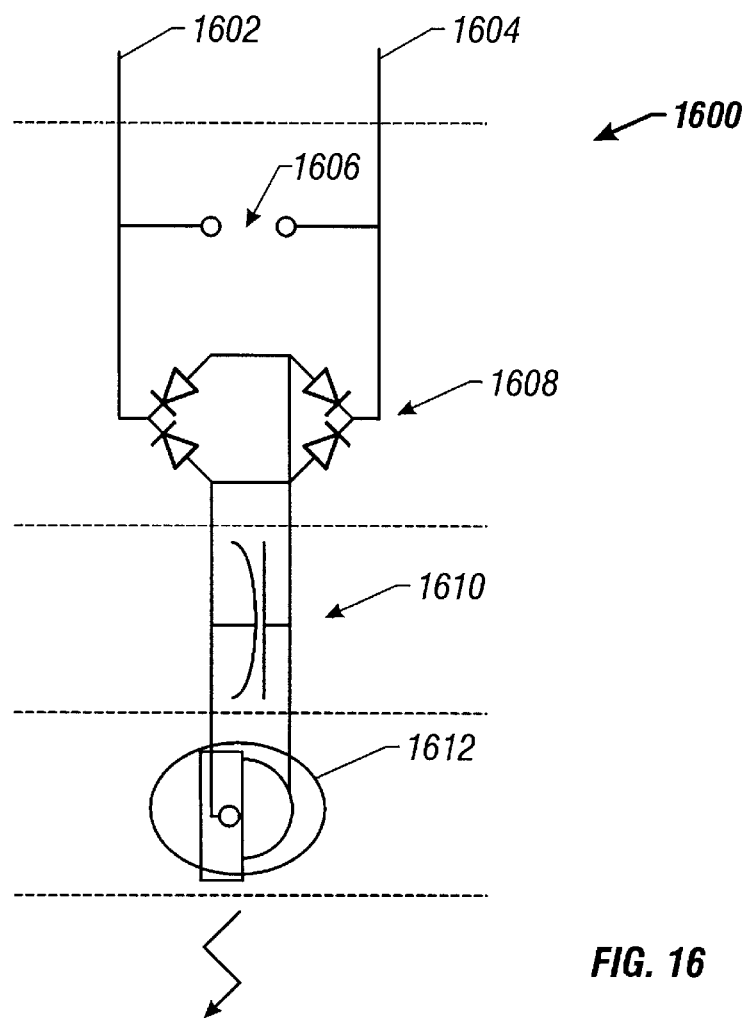
FIG. 16 is a schematic diagram of a threshold detection circuit for generating an optical output in the embodiments of, for example, FIGS. 6 through 12.

Referring next to FIG. 16, a schematic diagram is shown of an exemplary threshold circuit 1600 for generating an optical output or light output in the embodiments of FIGS. 6 through 15. In the embodiment shown, an unbalance detection signal is provided to a threshold circuit through two input electrodes 1602, 1604. Between the two input electrodes 1602, 1604 is positioned to spark gap 1606, for purposes of overvoltage protection, and a rectifier 1608. An output of the rectifier 1608 is applied across a capacitor 1610 and to a light source 1612, such as a neon lamp, having breakdown voltage at which it emits light.

In practice, as a charge builds on the capacitor 1610, also referred to as a signal accumulator, current in the light source 1612 is zero. As the voltage across the capacitor 1610 meets or exceeds the breakdown voltage for the light source 1612, however, the light source 1612 will flash, thereby discharging the signal accumulator, i.e., the capacitor 1610. The rate at which the signal capacitor 1610 then recharges is a function of the degree of unbalance. In turn, the rate at which the light source 1612 flashes is thus a function of the degree of unbalance. From this the control unit determines the degree of unbalance. If the degree of unbalance is below a second threshold but above a first threshold (a noise threshold) a signal is generated to signal that scheduled maintenance needs to be performed. If the degree if unbalance is above the second threshold, shutdown of the capacitor is initiated in order to avoid catastrophic failure. The control unit may consist of a counter for counting the number of flashes of light over a period, and a clock for measuring the period. At the end of the period, logic circuitry can be used to initiate an appropriate response in response to the value in the counter.

Alternatively, the threshold circuit could be an MOV or other active element functioning alone or in combination with passive components like capacitors and resistors. Once the signal is received by the threshold circuit, it can be rectified with a full wave bridge.

While the invention herein disclosed has been described by means of specific embodiments and applications thereof, numerous modifications and variations could be made thereto by those skilled in the art without departing from the scope of the invention set forth in the claims.

While the above description and embodiments assume high voltage applications, the methods and structures described may also be used with low voltage direct or alternating current applications.

Furthermore, the above description assumes that capacitors will always have a failure mode of shorting out. In some cases, the impedance of the individual capacitors may increase rather than decrease. This would be true, for example, if the capacitors were protected by internal fuses, or self-clearing electrodes are employed. Consistent with the teachings herein, detection schemes can easily be used for detecting increases in individual capacitor impedance and signaling failures accordingly.

What is claimed is:

1. A capacitor comprising:
   a housing;
   a first plurality of capacitor sections in a first series within the housing;
   a second plurality of capacitor sections in a second series within the housing;
   a first electrode coupled to a first terminal of the first series, and a first terminal of the second series, the first electrode being electrically contactable outside the housing;
   a second electrode coupled to a second terminal of the first series, and a second terminal of the second series, the second electrode being contactable outside the housing;
   means for comparing performance of the first series with performance of the second series, for detecting an unbalance in the first series and the second series, and for generating an output signal in response thereto, the output signal varying as a function of whether the unbalance is detected; and
   a signal output coupled to the means for comparing, the signal output transmitting said output signal to outside the housing.

2. The capacitor of claim 1 wherein said means for comparing comprises a current unbalance detection circuit.

3. The capacitor for claim 1 wherein said means for comparing comprises a differential current transformer.

4. The capacitor of claim 1 wherein said means for comparing comprises a voltage unbalance detection circuit.

5. The capacitor of claim 1 wherein said means for comparing comprises a current transformer.

6. The capacitor of claim 1 wherein said means for comparing comprises a potential transformer.

7. The capacitor of claim 1 wherein said means for comparing comprises an impedance divider.

8. The capacitor of claim 1 wherein said means for comparing comprises a differential voltage transformer.

9. The capacitor of claim 1 wherein said housing comprises a non-conductive surface.

10. The capacitor of claim 1 wherein said housing comprises a plastic insulated surface.

11. The capacitor of claim 1 wherein said first series and said second series comprise a low voltage capacitor bank characterized by a maximum voltage of 5 kilovolts.

12. The capacitor of claim 1 wherein said first series and said second series comprise a high voltage capacitor bank characterized by a minimum voltage of 10 kilovolts.

13. The capacitor of claim 1 wherein said means for comparing comprises means for measuring differences at a plurality of corresponding nodes between a plurality of capacitor sections in each of said first series and said second series.

14. The capacitor if claim 1 wherein said means for comparing includes means for generating a "normally on" output signal.

15. The capacitor of claim 14 wherein said means for generating a "normally on" signal comprises a capacitor voltage divider.

16. The capacitor of claim 15 wherein said capacitor voltage divider is coupled between said first electrode and said second electrode.

17. The capacitor of claim 14 wherein said means for generating a "normally on" signal comprises a resistor voltage divider.

18. The capacitor of claim 17 wherein said resistor voltage divider is coupled between said first electrode and said second electrode.

19. The capacitor of claim 14 wherein said means for generating a "normally on" signal comprises a current transformer.

20. The capacitor of claim 1 wherein said means for comparing includes means for generating a "normally off" output signal.

21. The capacitor of claim 1 wherein said signal output comprises a fiber optic conductor.

22. The capacitor of claim 1 wherein said signal output comprises a sound generator.

23. The capacitor of claim 1 wherein said signal output further comprises an acoustic waveguide.

24. The capacitor of claim 1 wherein said signal output further comprises a voltage isolator.

25. The capacitor of claim 24 wherein said signal output further comprises electrical conductors.

26. The capacitor of claim 1 wherein said output signal varies from a signal indicating a balanced condition, incipient failure, and immanent failure as a function of a degree of capacitor failure.

27. A capacitor comprising:

a housing;

a first electrode contactable from outside the housing;

a second electrode contactable from outside the housing; and an unbalance detection output, wherein an unbalance detection signal indicative of a degree of unbalance is transmitted from the unbalance detection output.

28. The capacitor of claim 27 further comprising:

a first plurality of capacitor sections in a first series within said housing;

a second plurality of capacitor sections in a second series within said housing;

said first electrode being coupled to a first terminal of the first series, and a first terminal of the second series, the first electrode being electrically contactable outside said housing; and a second electrode coupled to a second terminal of the first series, and a second terminal of the second series, the second electrode being contactable outside the housing.

29. The capacitor of claim 27 further comprising:

means for comparing performance of the first series with performance of the second series, for detecting an unbalance in the first series and the second series, and for generating said unbalance detection signal in response thereto, the unbalance detection signal varying as a function of whether the unbalance is detected and being provided.

30. The capacitor of claim 27 wherein said housing comprises a plastic insulated surface.

31. The capacitor of claim 27 wherein said unbalance detection signal varies from a signal indicating a balanced condition, incipient failure, and immanent failure as a function of a degree of capacitor failure.

32. A method of operating a capacitor comprising:

coupling a first electrode of the capacitor to a system;

coupling a second electrode of the capacitor to the system;

applying a voltage across the first and second electrodes;

detecting an unbalance within the capacitor;

determining whether a degree of such unbalance is greater than a first threshold and less than a second threshold;

signaling the detected unbalance in the event the degree of such unbalance is greater than a first threshold and less than a second threshold;

determining whether the degree of such unbalance is greater than the second threshold; and initiating a shutdown of the capacitor in the event the degree of such unbalance is greater than the second threshold.

33. The method of claim 32 wherein said detecting of said unbalance within said capacitor comprises comparing a voltage at a first node of a first current path with a voltage at a second node of a second current path, said first current path being arranged in parallel with said second current path.

34. The method of claim 32 wherein said detecting of said unbalance within said capacitor comprising comparing an amount of current flowing in a first current path with an amount of current flowing in a second current path, said first current path being arranged in parallel with said second current path.

* * * * *

UNITED STATES PATENT AND TRADEMARK OFFICE
CERTIFICATE OF CORRECTION

PATENT NO : 6,107,808
DATED : August 22, 2000
INVENTOR(S): McKee, et al.

It is certified that error appears in the above-identified patent and that said Letters Patent are hereby corrected as shown below:

TITLE PAGE: On the title page, following "Assignee:", replace "Maxwell Energy Products, Inc., San Diego, Calif." with -- General Atomics, San Diego, Calif.--.
CLAIMS: At column 16, line 35, change "if" to --of--. At column 17, line 1, change "immanent" to --imminent--. At column 18, line 3, change "immanent" to --imminent--.

Signed and Sealed this

Tenth Day of April, 2001

Attest:

NICHOLAS P. GODICI

Attesting Officer    Acting Director of the United States Patent and Trademark Office